United States Patent [19]

Shinada

[11] Patent Number: 4,504,332
[45] Date of Patent: Mar. 12, 1985

[54] METHOD OF MAKING A BIPOLAR TRANSISTOR

[75] Inventor: Kazuyoshi Shinada, Yokohama, Japan

[73] Assignee: VLSI Technology Research Association, Japan

[21] Appl. No.: 374,232

[22] Filed: May 3, 1982

Related U.S. Application Data

[63] Continuation of Ser. No. 72,835, Sep. 6, 1979, abandoned.

[30] Foreign Application Priority Data

Sep. 14, 1978 [JP] Japan .............................. 53/113348

[51] Int. Cl.$^3$ ................. H01L 21/225; H01L 21/265; H01L 21/28
[52] U.S. Cl. .................................. 148/187; 148/175; 148/188; 29/578; 29/591; 357/34
[58] Field of Search .................. 148/175, 187, 188; 29/578, 591; 357/34

[56] References Cited

U.S. PATENT DOCUMENTS

| | | | |
|---|---|---|---|
| 3,600,651 | 8/1971 | Duncan | 357/59 |
| 3,796,613 | 3/1974 | Magdo et al. | 357/50 |
| 3,947,299 | 3/1976 | Weijland et al. | 357/59 |
| 4,074,304 | 2/1978 | Shiba | 148/175 X |
| 4,101,350 | 7/1978 | Possley et al. | 148/175 |
| 4,157,269 | 6/1979 | Ning et al. | 148/175 X |

FOREIGN PATENT DOCUMENTS

40874 10/1978 Japan.

OTHER PUBLICATIONS

Saraswat et al., "A New Bipolar Process–Borsenic", IEEE Journal of Solid State Circuits, vol. SC-11, No. 4, Aug. 1978, pp. 495–499.

Primary Examiner—G. Ozaki
Attorney, Agent, or Firm—Finnegan, Henderson, Farabow, Garrett & Dunner

[57] ABSTRACT

This invention provides a method for manufacturing a bipolar transistor which comprises steps of selectively forming in the surface of a semiconductor substrate an embedded layer of a conductivity type opposite to that of the substrate, covering the substrate with an insulating layer doped, at the surface thereof with an impurity in the superficial region thereof, removing by etching the insulating layer to form an opening portion through which part of the embedded layer is exposed, simultaneously forming by epitaxial growth a single-crystal semiconductor layer of the same conductivity type as that of the embedded layer on the embedded layer at the opening portion and a polycrystalline semiconductor layer on the insulating layer, diffusing by heating the impurity in the insulating layer into the polycrystalline semiconductor layer to provide a conductivity type opposite to that of the single-crystal semiconductor layer, and successively forming an internal base region and an emitter region in the single-crystal semiconductor layer. The invention also provided a bipolar transistor manufactured by the aforementioned method.

5 Claims, 8 Drawing Figures

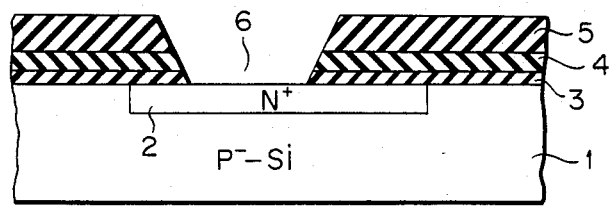
F I G. 1
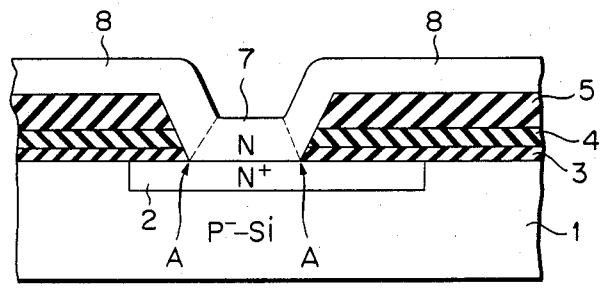
F I G. 2
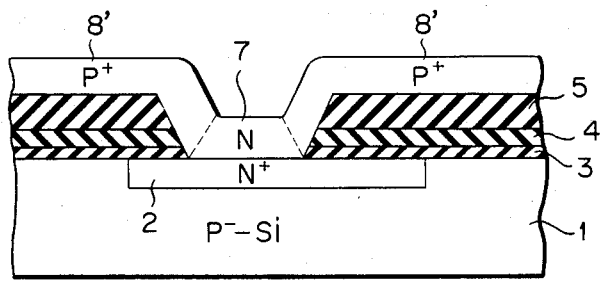
F I G. 3
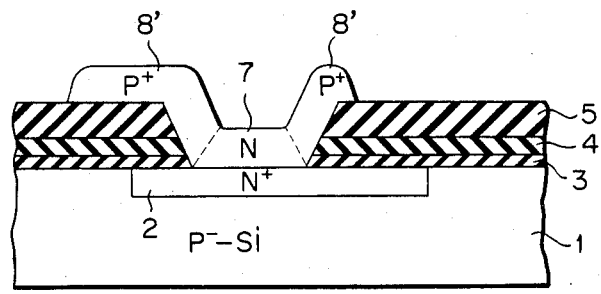
F I G. 4

METHOD OF MAKING A BIPOLAR TRANSISTOR

This is a continuation of application Ser. No. 06/072,835, filed Sept. 6, 1979, now abandoned.

BACKGROUND OF THE INVENTION

This invention relates to a semiconductor device capable of integrating a bipolar transistor without requiring any special element isolation region and a method for manufacturing the same.

In a conventional bipolar integrated circuit, elements are electrically separated from one another by what is called a pn junction isolation method employing impurity diffusion. As these elements become finer to provide higher packing density, the area covered by element isolation regions becomes less negligible, giving rise to a substantial hindrance to the improvement in the packing density and further to the high-speed operation of the circuit. Moreover, in a conventional bipolar transistor of planar construction, a base region is embedded in a collector region, so that an unnecessary base-collector junction area is large. Further, despite a high-concentration embedded layer at the bottom of the collector region, the collector resistance is large enough to hinder the high-speed operation because a collector electrode terminal is taken out though the surface of the substrate.

SUMMARY OF THE INVENTION

The object of this invention is to provide a method for manufacturing a semiconductor device capable of forming a bipolar transistor without requiring an element isolation region, and hence to provide a semiconductor device capable of achieving high packing density and high-speed operation of an integrated circuit.

According to this invention, there may be provided a method for manufacturing a semiconductor device comprising a step of selectively forming in the surface of a semiconductor substrate an embedded layer of a conductivity type opposite to that of the substrate, a step of covering the substrate having the embedded layer formed therein with an insulating layer containing an impurity at least in the superficial region thereof, a step of removing by etching the insulating layer on the embedded layer to provide an opening portion through which at least part of the embedded layer is exposed, a step of simultaneously forming by epitaxial growth a single-crystal semiconductor layer of the same conductivity type as that of the embedded layer on the embedded layer at the opening portion and a polycrystalline semiconductor layer on the insulating layer, a step of diffusing by heating the impurity in the insulating layer into the polycrystalline semiconductor layer to provide the polycrystalline semiconductor layer with a conductivity type opposite to that of the single-crystal semiconductor layer, a step of heat-treating in an $O_2$-containing atmosphere the surface of the polycrystalline semiconductor layer and the surface of the single-crystal semiconductor layer to form on the surfaces a thermal oxide layer having a portion on the single-crystal semiconductor thinner than the portion on the polycrystalline semiconductor layer, a step of etching the thermal oxide layer until the portion of the thermal oxide layer on the single-crystal semiconductor layer is etched off, leaving the thermal oxide layer on the polycrystalline semiconductor layer, and a step of successively forming by implantation and/or diffusion an internal base region and an emitter region in the single-crystal semiconductor layer.

Further, according to the invention, there may be provided a semiconductor device manufactured by the aforementioned method.

BRIEF DESCRIPTION OF THE DRAWINGS

FIGS. 1 to 8 are schematic sectional views illustrating steps of manufacturing a semiconductor device according to an embodiment of this invention.

DETAILED DESCRIPTION OF THE PREFERRED EMBODIMENT

Basically, this invention intends to provide a method for manufacturing a bipolar transistor which requires no conventional element isolation region, including steps of selectively forming in the surface of a semiconductor substrate an embedded layer of a conductivity type opposite to that of the substrate, covering the substrate with an insulating layer, removing by etching the insulating layer on the embedded layer to form an opening portion, and growing at the opening portion a single-crystal semiconductor layer of the same conductivity type as that of the embedded layer which is to serve as a collector region. When thus growing the single-crystal semiconductor layer, a polycrystalline semiconductor layer may simultaneously be grown on the surface of the insulating layer except the opening portion. Hereupon, at least the superficial portion of the insulating layer is previously doped with an impurity before such impurity is diffused into the polycrystalline semiconductor layer to provide the layer with a conductivity type opposite to that of the single-crystal semiconductor layer. The polycrystalline semiconductor layer may be used as an external base region. When the grown semiconductor layers are oxidized by heating, thin and thick thermally oxidized layers are formed on the surfaces of the single-crystal and polycrystalline semiconductor layers, respectively. Since thus formed oxide layers would share the same etching speed, the portion of the oxide layer on the polycrystalline semiconductor layer may remain partially even though the oxide layer on the single-crystal semiconductor layer is completely recovered by etching. Thus, a bipolar transistor with all regions formed by self-aligning may be obtained by successively forming by diffusion an internal base region and an emitter region with the remaining oxide layer on the polycrystalline layer used as a mask.

Figure 5:
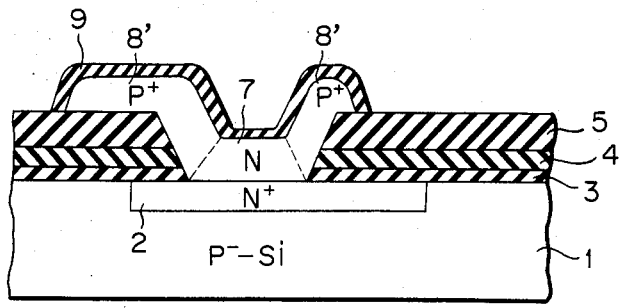
Figure 6:
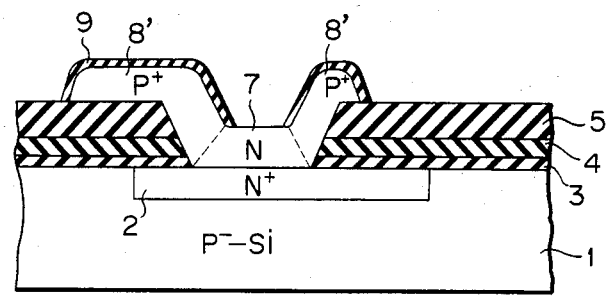
Figure 7:
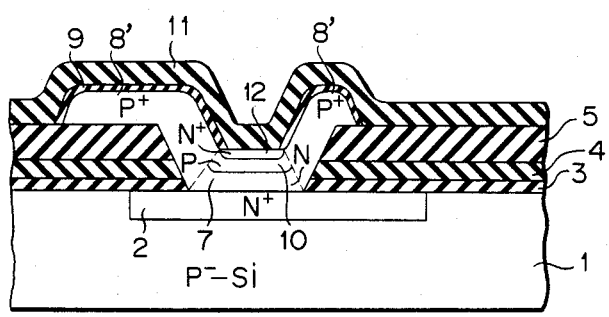
Figure 8:
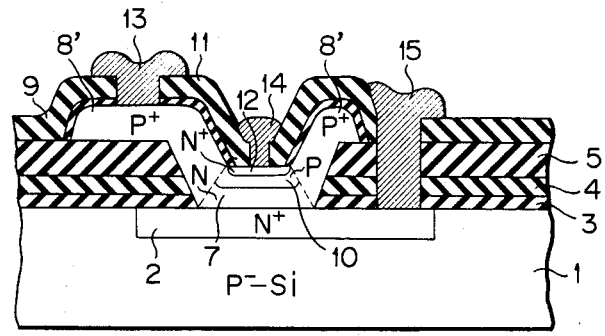

Now there will be described in detail an embodiment of this invention with reference to the accompanying drawings. FIGS. 1 to 8 are sectional views of an element region of the embodiment integrating an NPN transistor, showing manufacturing processes therefor in order. First, as shown in FIG. 1, an $N^+$-type embedded layer 2 is formed by diffusing arsenic into the surface of a $P^-$-type Si substrate 1 with a surface bearing of (100) and a specific resistance of 10 to 20 $\Omega$·cm, and thereafter a thermal oxide layer 3 approximately 200 Å thick, a silicon nitride layer 4 approximately 500 Å thick, and an approximately 2,000 Å oxide layer 5 doped with boron at high concentration are formed successively over the whole surface of the substrate 1. Then, such three-layer insulating layer is etched with a taper in a conventional manner to provide an opening 6 through which part of the embedded layer 2 is exposed. In this case, the silicon nitride layer 4 tends to prevent boron in the boron-doped oxide layer 5 from diffusing into the substrate 1, while the thermal oxide layer 3 has a function to relieve the distortion of the structure. Thereafter, an N-type epitaxial layer with a thickness of 0.6 μm and a specific resistance of 0.2 Ω·cm is formed by the gaseous growth method based on the pyrolysis of SiH₄. Due to the existence of the silicon nitride layer 4, epitaxial growth may be effected normally at the interface of the insulating layer and the substrate, as indicated by "A" in FIG. 2. Thus, as shown in FIG. 2, an N-type single-crystal Si layer 7 and a high-specific-resistance polycrystalline Si layer 8 are grown on the opening portion 6 and the remaining portion, respectively. In the drawing, broken lines indicate the interface of the single-crystal Si layer 7 and the polycrystalline Si layer 8. Subsequently, boron in the boron-doped oxide layer 5 is diffused into the polycrystalline Si layer 8 by heat treatment in an $N_2$ atmosphere at 1,100° C. for 30 minutes, thereby changing the layer 8 into a P+-type polycrystalline Si layer 8', as shown in FIG. 3. Since the diffusion coefficient of impurity in polycrystalline Si is large, the sheet resistance of the polycrystalline Si layer 8' may easily attain 40 Ω/□ or thereabout. Thereupon, the polycrystalline Si layer 8' is removed by etching except for a predetermined portion thereof surrounding the single-crystal Si layer 7 which is to be left as an external base region, as shown in FIG. 4. Then, the layer 8' and layer 7 are heat-treated in a wet $O_2$ atmoshere at 1,000° C. for 15 minutes to form a thermal oxide layer 9 as shown in FIG. 5. The thermal oxide layer 9 is approximately 1,500 Å thick on the single-crystal Si layer 7 and about 3,000 Å thick on the polycrystalline Si layer 8'. Subsequently, as shown in FIG. 6, the thermal oxide layer 9 on the single-crystal Si layer 7 is removed by using an HF-system etchant. Due to the difference in thickness, the portion of the thermal oxide layer 9 on the polycrystalline Si layer 8' remains approximately 1,500 Å thick. Thereafter, as shown in FIG. 7, a P-type internal base region 10 with a diffusion depth of 0.3 μm and a layer sheet resistance of 700 Ω/□ is formed by boron ion implantation (50 KeV, $10^{14}$ cm$^{-2}$) and heat treatment at 900° C. for 20 minutes, and then an N+-type emitter region 12 with a diffusion depth of 0.2 μm and a layer sheet resistance of 30 Ω/58 is formed in the P-type internal base region 10 by depositing a 2,000-Å arsenic-doped oxide layer 11 and heating the same in an $O_2$ atmosphere at 1,000° C. for 10 minutes. Finally, to complete the structure as shown in FIG. 8, contact holes are formed as required, and base, emitter, and collector electrodes 13, 14 and 15 are taken out respectively on the P+-type polycrystalline Si layer 8' as the external base region, the N+-*type emitter region* 12, *and the N+*-type embedded layer 2 by evaporating and patterning Al-Si electrode material.

As may be seen from these drawings, the structure of this embodiment can be provided with the collector, external base, internal base, and emitter regions in self-alignment by means of easy processing technique without requiring any element isolation region that is essential to the prior art structure, so that high packing density may be achieved for the bipolar device. Moreover, the ease of the manufacturing processes and the self-aligning formation of each element region will improve the yield of product and reliability. Furthermore, unlike the construction of the conventional bipolar device, the collector resistance, as well as the junction area of the collector and base regions, may be reduced, thereby enabling high-speed operation.

This invention is not limited to the above-mentioned precise embodiment. Although in the above embodiment the internal base region and the emitter region are formed by the self-alignment method, they may otherwise be formed according to a well-known manufacturing process, e.g. by a method to form the internal base region and the emitter region separately by using a conventional masking means. Moreover, although the insulating layer formed on the substrate, according to the above embodiment, is of three-layer consturction, it need not always be so, but may include more or fewer layers. What is essential is that at least the superficial portion of the insulating layer be doped with impurity so as not to allow the impurity to be diffused into the substrate, during the diffusion of impurity into the polycrystalline layer on the insulating layer by heat-treatment or the like. Furthermore, although the manufacturing processes for an NPN transistor have been described in connection with the above embodiment, it is to be understood that a PNP transistor may also be manufactured in substantially the same manner. Additionally, the polycrystalline layer, which is used only as the external base region in the above embodiment, may be employed as a wiring layer as required.

What is claimed is:

1. A method for manufacturing a semiconductor device, comprising the steps of:
   (i) selectively forming in the surface of a semiconductor substrate an embedded layer of a conductivity type opposite to that of said substrate;
   (ii) covering said substrate having said embedded layer formed therein with an insulating layer containing an impurity at least in the superficial region thereof;
   (iii) removing by etching said insulating layer on said embedded layer to provide an opening portion through which at least part of said embedded layer is exposed;
   (iv) simultaneously forming by epitaxial growth a single-crystal semiconductor layer of the same conductivity type as that of said embedded layer on said embedded layer at said opening portion and a polycrystalline semiconductor layer on said insulating film;
   (v) diffusing by heating the impurity in said insulating layer into said polycrystalline semiconductor layer to provide said polycrystalline semiconductor layer with a conductivity type opposite to that of said single-crystal semiconductor layer;
   (vi) heat-treating in an $O_2$-containing atmosphere the surface of said polycrystalline semiconductor layer and the surface of said single-crystal semiconductor layer to form on said surfaces a thermal oxide layer having a portion on said single-crystal semiconductor layer thinner than the portion on said polycrystalline semiconductor layer;
   (vii) etching said thermal oxide layer until the portion of said thermal oxide layer on said single-crystal semiconductor layer is etched off, leaving the thermal oxide layer on said polycrystalline semiconductor layer; and
   (viii) successively forming an internal base region and an emitter region in said single-crystal semiconductor layer by self-alignment using the remaining thermal oxide layer as a mask.

2. A method according to claim 1 wherein said internal base region and said emitter region are formed in said single-crystal semiconductor layer by implantation.

3. A method according to claim 1 wherein said internal base region and said emitter region are formed in said single-crystal semiconductor layer by diffusion.

4. A method according to claim 1, wherein said step of covering said substrate with said insulating layer containing the impurity consists of forming a thermal oxide layer over the whole surface of said substrate including said embedded layer, forming a silicon nitride layer on said thermal oxide layer, and further forming on said silicon nitride layer an oxide layer doped with an impurity to provide a conductivity type opposite to that of said embedded layer.

5. A method according to claim 4, which further includes, before the heat-treating step and after the diffusion step, a step of removing by etching a portion of said polycrystalline semiconductor layer except for a predetermined portion of said polycrystalline semiconductor layer left as an external base region surrounding said single-crystal semiconductor layer left as a collector region.

* * * * *